(12) United States Patent
Hofmeister

(10) Patent No.: US 6,309,161 B1
(45) Date of Patent: Oct. 30, 2001

(54) LOAD LOCK WITH VERTICALLY MOVABLE SUPPORT

(75) Inventor: Christopher A. Hofmeister, Hampstead, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 09/433,260

(22) Filed: Nov. 4, 1999

(51) Int. Cl.[7] .................................................. H01L 21/00
(52) U.S. Cl. ............................................... 414/221; 414/939
(58) Field of Search .............................. 414/217, 217.1, 414/221, 416, 331.14–331.18, 937, 939, 940, 805, 811

(56) References Cited

U.S. PATENT DOCUMENTS

| | | | |
|---|---|---|---|
| 5,944,857 | * | 8/1999 | Edwards et al. ................... 29/25.01 |
| 6,042,623 | * | 3/2000 | Edwards ........................... 414/217 X |
| 6,048,154 | * | 4/2000 | Wytman ............................ 414/217 |
| 6,059,507 | * | 5/2000 | Adams ............................. 414/217.1 |

* cited by examiner

Primary Examiner—Robert P. Olszewski
Assistant Examiner—Gerald J. O'Connor
(74) Attorney, Agent, or Firm—Perman & Green, LLP

(57) ABSTRACT

A load lock has a substrate carrier movable between one position and another position each position vertically separated from the other, to locate the carrier at vertically discrete positions to load substrates onto the carrier or remove substrates from the carrier. A ring seal is provided around the substrate carrier for opening and closing the load lock chamber to the vacuum transport apparatus by controllably vertically positioning it between an uppermost and a lowermost position within the load lock.

20 Claims, 4 Drawing Sheets

LOAD LOCK WITH VERTICALLY MOVABLE SUPPORT

BACKGROUND OF THE INVENTION

Field of the Invention

The apparatus of the present invention relates generally to material transfer devices. The material transferred might include, but not be limited to, semiconductor wafers of any shape, such as silicon and gallium arsenide, semiconductor packaging substrates, such as high density interconnects, semiconductor manufacturing process imaging plates, such as masks or reticles, and large display panels, such as, active matrix LCD substrates.

The present invention relates generally to material transfer devices, and in particular, to load locks for introducing a substrate between an atmosphere environment and a vacuum environment, and relates more particularly to an improvement in such load locks whereby costs in labor and parts are saved substantially through such improvements.

The need for high throughput transport devices which can move a substrate or work piece between remote locations within highly confined areas as defined by a limited footprint, such as found in the manufacturing of wafers or panels used in the semiconductor industry are in high demand. This is because in the process of manufacturing, not just in the semiconductor industry, the need to move a workpiece from one position to the next not only requires a high throughput rate, but also accurate repeatability of placement of workpieces in registration at predetermined orientations on the support surface. Still a further constraint is to fabricate a positioning machine which is capable of working in a cleanroom environment where the existence of particulates is minimized if not made non-existent.

The use of load locks and the means for moving media between atmosphere and the internal vacuum environment is well known in the art. These load locks must include a first gate valve for communicating the internal chamber of a load lock with an outside atmosphere and a second gate valve communicating the interior confines of the load lock with the internal confines of the main transport chamber which is in communication with the load lock chamber when the gate valve is open. The requirement for two such gate valves in each load lock causes an increased expenditure of manufacturing costs to the unit as well as duplicating similar if not identical systems with respect to each of the gate valves in the involved load lock.

Accordingly, it is an object of the present invention to provide a load lock which is capable of opening to both an atmosphere environment and a material processing vacuum environment.

It is a further object of the invention to provide a load lock of the aforementioned type that includes an articulated seal which seals the load lock from either atmosphere or vacuum depending on the mode of use of the load lock.

Still a further object of the invention is to provide a load lock of the aforementioned type usable in a system whereby substrates are processed in a continuous and uninterrupted manner.

Yet still a further object of the invention is to provide a load lock gate valve which is capable of being manufactured with relatively low manufacturing costs.

Other objects and advantages of the invention will be described in the following specification and the appended claims.

SUMMARY OF THE INVENTION

The invention resides in a load lock whereby the substrate carrier is movable between one position and another position vertically separated from another to locate the carrier at vertically discrete positions and whereby a seal ring is provided around the substrate carrier for opening and closing the chamber to the vacuum transport apparatus by controllably vertically positioning it between an uppermost and a lowermost position within the load lock.

The invention further resides in a load lock having a housing. The housing defines an internal chamber having a first and second opening. A substrate carrier is located within the housing and is movable through the second opening. A seal ring is provided having a first and second seal. The seal ring is disposed within the housing and is movable, independent of the substrate carrier, between a closed position at which the first opening is blocked and a open position at which the first opening is open to the internal chamber. When the first opening is open to the internal chamber, the substrates can be moved along a substrate path through the first opening onto the substrate carrier.

DETAILED DESCRIPTION OF THE PREFERRED EMBODIMENTS

Figure 1:
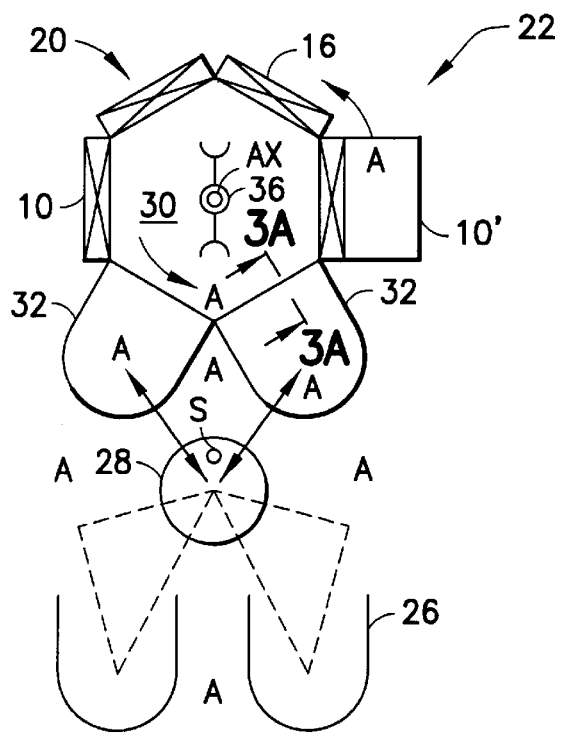
FIG. 1 is plan view of a layout of a processing system in accordance with the invention.

Turning now to the drawings, FIG. 1 illustrates a processing system 20 for operating on planar substrates which may include wafers or flat panels. As noted earlier, the terms "wafer" or "substrate" will be used for purposes of consistency only to refer to such substrates, but it will be understood that it is intended to be used in broad context so as to be applicable to all substrate types regardless of shape or size. Also, like reference numerals used herein depict similar elements in different embodiments. The processing system 20 may be arranged for example in side-by-side fashion within a clean room 22.

In any case, it is customary to carry a large number of substrates or work pieces S within a cassette 26 or within a controlled environment carrier box. These cassettes or carrier boxes are illustrated schematically at 26 in FIG. 1. In such instances, a plurality of substrates is loaded into the cassette 26 where each substrate is supported in a spaced, stacked relationship and then transported onto a shelf in the system 20 to await entry for processing into the transport chamber 30.

As illustrated schematically in FIG. 1, a robot 28 located between the system 20 and the cassettes 26, 26 positioned for ease of reference on a stand, moves the substrates S between the shelves of the cassette or boxes 26 and into the system 20. It should be understood that the robot 28 operates in a non-vacuum environment while the system 20 operates in a vacuum environment. Therefore, load locks 32,32 are provided as the interface between the robot 28 and the vacuum environment found in the main transport chamber 30.

As illustrated in FIG. 1, the main transport chamber 30 includes a transfer device 36, which is vertically movable about the axis AX and is rotationally selectively positionable about the axis AX in 360°. A plurality of processing stations 10' are disposed about the facets of the main transport chamber 30. These processing chambers are in turn interfaced with the transport chamber 30 through the intermediary of gate valves 10 which controllably open and close to permit passage of a substrate between processing stations.

As illustrated in FIG. 1, one or more aligner mechanisms presented by the reference element A can be positioned at the various locations enumerated by the element A. The aligner is provided to cause direct registration of a substrate on the handling devices while the substrate is being handled by the system.

Figure 2:
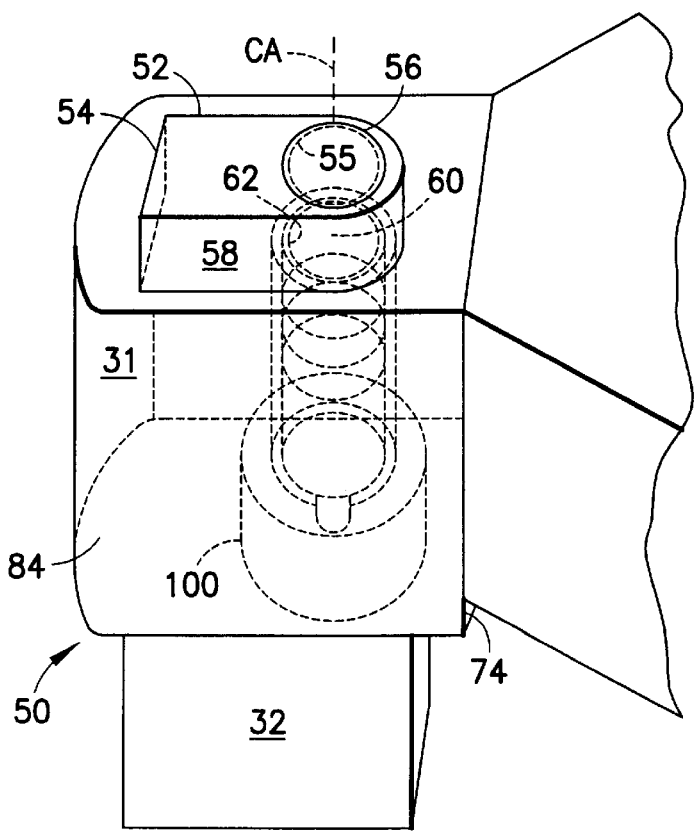
FIG. 2 shows a partially fragmentary perspective view of a load lock of the present invention connected to a main transport device.

In accordance with the invention, it should be seen that the load lock illustrated at 32 in FIG. 2 has a main body portion 50 which includes an upper shroud member 52 with an open face 54 directed toward the external robot 28. The open face 54 permits the robot arm to move inwardly into the shroud so as to intersect with the central axis CA of the load lock 32. The load lock 32 can be formed as a single piece and mechanically mounted by bolting or welding to the facet of the transport chamber 30, or alternatively, can be milled or machined into the chamber 30 as an integral part of it.

The shroud 52 further has a removable cap 56 which is disposed concentrically about the central axis CA and sits within a corresponding opening 55 in the top surface of the shroud. The cap 56 when removed allows access to the interior confine 58 of the shroud. Thus, the interior confine 58 of the shroud 52 is exposed to atmosphere through the open face 54 and through the opening 55 when the cap 56 is removed.

Figure 3A:
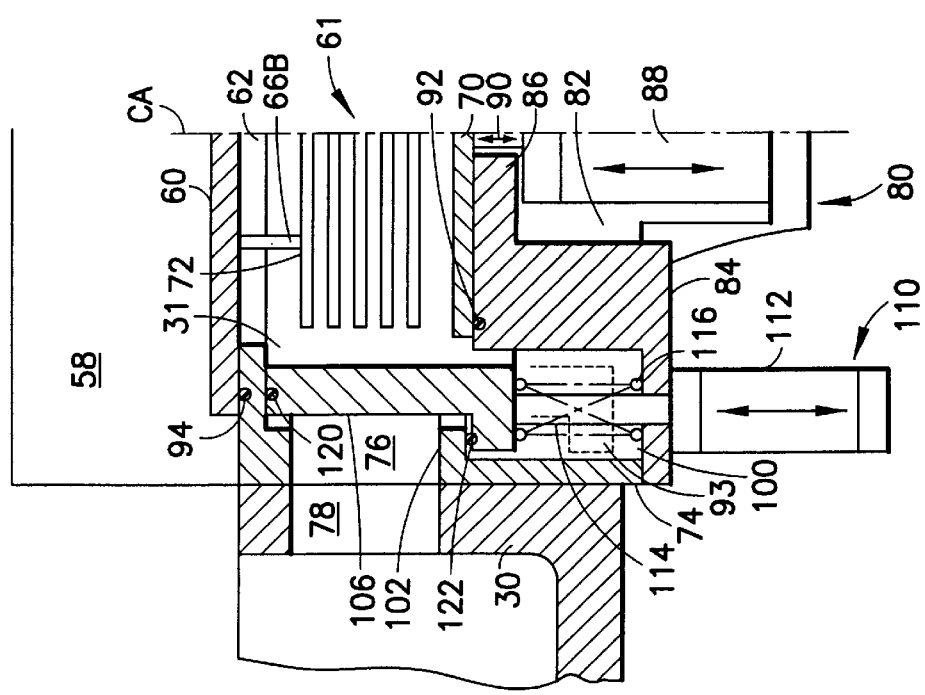
FIG. 3A is a partially fragmentary vertical section through a load lock shown in FIG. 1 which is a half showing of the structure.
Figure 3B:
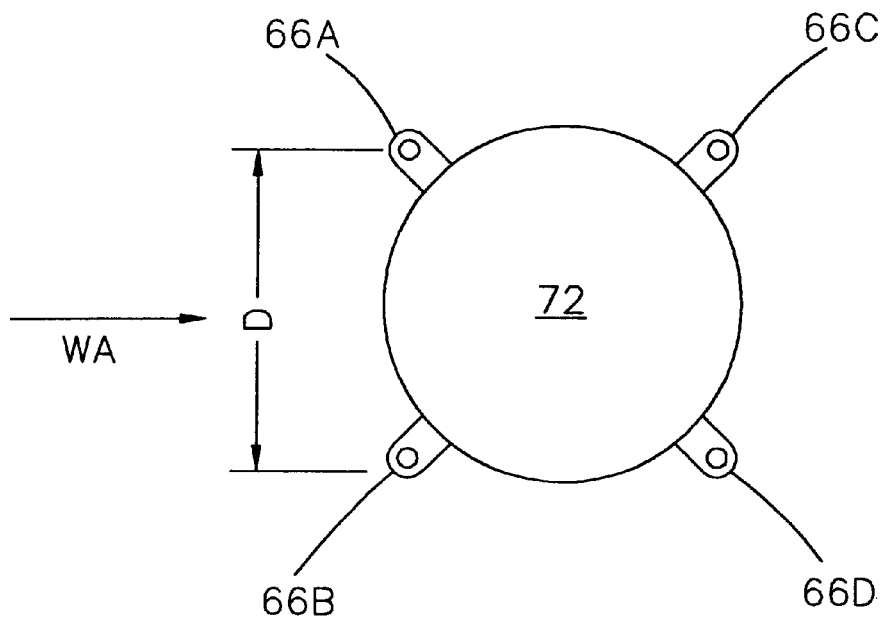
FIG. 3B is a horizontal sectional view through the support posts of the substrate carrier shown in FIG. 3C.
Figure 3C:
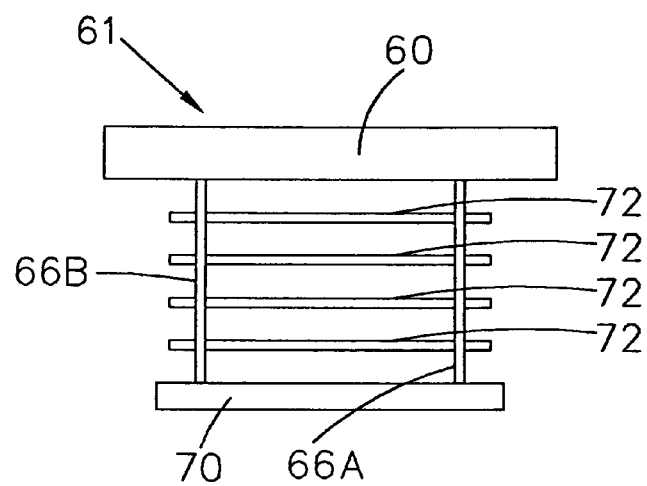
FIG. 3C is detail side elevation view of a component partially illustrated in FIGS. 3A and 3B.

As illustrated in FIGS. 3A, 3B and 3C, a sealing plate 60 is provided as part of the load lock 32 and selectively controllably seals an opening 62 formed in the top of the load lock from atmosphere. The sealing plate 60 is vertically movable along the central axis CA between a topmost position and a bottommost position. The opening 62 is formed in the top surface of the housing body 50 of the load lock and communicates with the internal chamber 58 of the shroud 52 when the cover sealing plate 60 is in a vertical up condition, spaced above the opening 62. Fixed to and depending from the sealing plate 60 are four support posts 66A–66D which run vertically between the lower surface of the upper plate 60 and a lowermost support plate 70.

Fixedly disposed on the vertically disposed rods 66A–66D are a plurality of vertically stacked and spaced apart horizontally disposed shelves 72 which connect substantially tangentially to the side edges of the shelves in the manner shown in FIG. 3B so as to not interfere with the inwardly directed movement along line WA onto the shelving 72. That is, the rod pairs 66A, 66B and 66C, 66D are spaced apart from one another by the distance D which is greater than the diameter of the substrates S which are to be moved onto the shelves 72, 72.

Figure 4:
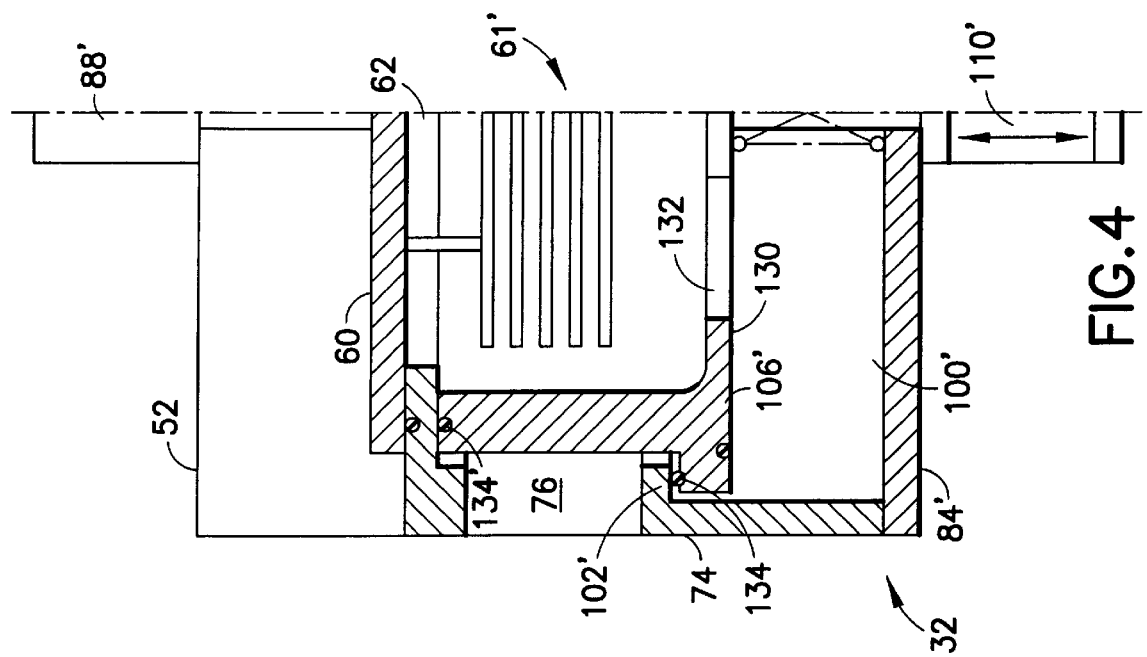
FIG. 4 is a second embodiment of a load lock in accordance with the invention shown in half view.
Figure 5:
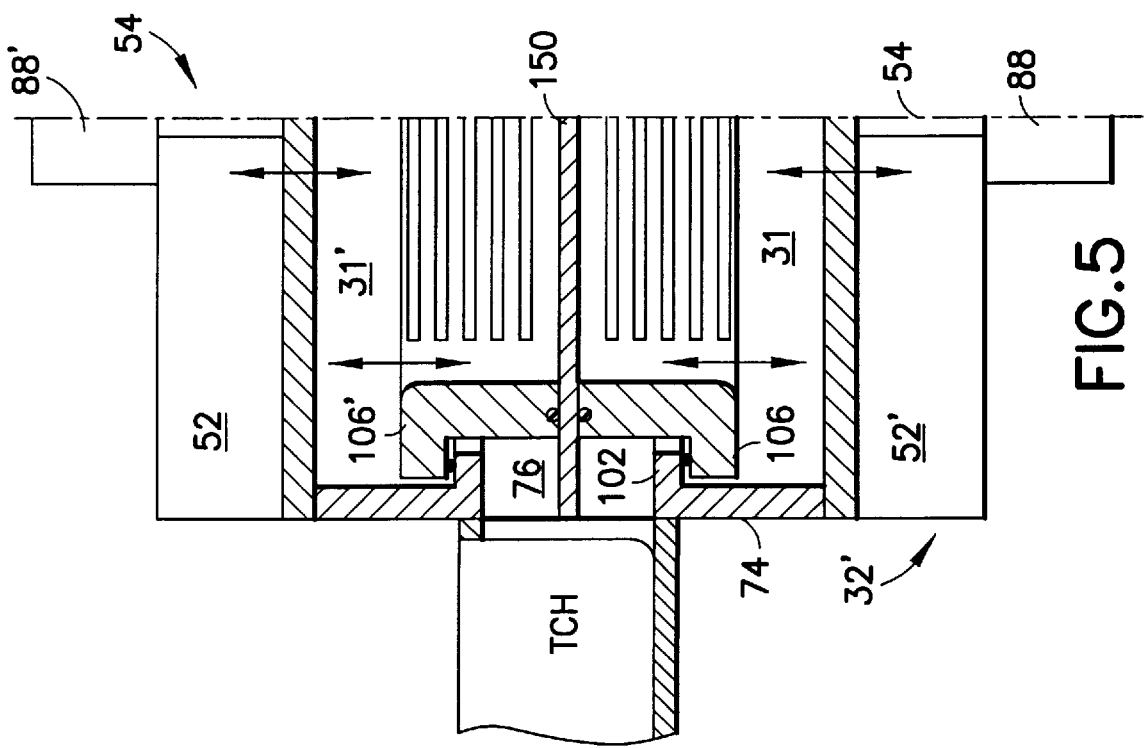
FIG. 5 is a third embodiment of a load lock in accordance with the invention shown in half view.

As seen in the FIGS. 3A, 4 and 5, the front face 74 of the load lock 32 has a slot 76 formed in it which communicates with a correspondingly located and sized slot 78 formed in the transport chamber 30. The handling device 36 with a substrate S disposed thereon is capable of moving through the slots 78 and 76 respectively formed in the transport chamber 30 and into the load lock 32 so as to place a substrate on a selected one of the shelves 72, 72 without interference from either of the support rods which straddle the wafer travel path WA (see FIG. 3B).

The load lock 32 further includes a vertical positioning means 80 which in the embodiment of FIG. 3A is located within a well 82 formed in the base plate 84 of the load lock. For this purpose, the vertical positioning means 80 includes an opening 86 formed through the base plate 84 and located coincidentally with the central axis CA of the load lock. A vertical actuator 88 is mounted to the base plate 84 of the load lock. The vertical actuator 88 has an extending and retracting piston 90 which is received within the opening 86 in the base plate 84 and is secured to the bottom of the lower plate 70 of the substrate carrier 61. In this way, the substrate carrier 61 is vertically movably positionable at selectively different heights along the central axis CA through the controlled energization and deenergization of the vertical actuator 88. The vertical actuator 88 may take many different forms, but in the preferred embodiment, it is a cylindric pneumatic actuator. Also disposed about the central axis CA under the base plate 70 of the substrate carrier 61 is a closed form seal 92, and under sealing plate 60 is a closed form seal 94 which causes the internal chamber 31 of the load lock 32 be sealed to vacuum when the cassette carrier 61 is moved by the actuator means 80 to its lowermost position as illustrated in FIG. 3A.

The base plate member 84 of the load lock further includes an annular well 100 disposed concentrically about the central axis CA. The annular well 100 extends 360° about the central axis CA and is disposed radially from the CA axis between the slot 76 of the load lock and the internal chamber 31. The well is further defined by a radially inwardly directed shoulder 102 which defines the outer top circumference of the annular well 100.

Located within the annular well 100 is a rigid seal ring 106 which is movable between a vertically disposed top position coincident with the internal chamber 31 being isolated from the vacuum of the transport chamber 30 and a lowermost position (shown in phantom line 93) corresponding to the internal chamber 31 of the load lock 32 being open to vacuum of the transport chamber 30. For this purpose, the seal ring 106 is connected to a second vertical actuator means 110 which is mounted to and coacts between the base plate member 84 of the load lock 32 and the bottom of the seal, ring 106. The second vertical actuator means 110 includes a vertical actuator 112 which is mounted below the base plate member 84, an actuator rod 114 surrounded by a bellows seal 116 which connects between the base of the seal ring 106 and the base plate member 84 of the load lock 32. It should be understood that the second vertical actuator means 110 should be provided as a pair and are disposed diametrically symmetrically about the well 100 in order to avoid undesirable torques in the seal ring 106.

As illustrated, the seal ring 106 in vertical cross section has a generally L-shape defined by a vertically extending portion and an intersecting horizontal portion formed L-shaped portion directed radially outwardly thereof. As illustrated in FIG. 3A, the top end portion of the seal ring 106 includes a seal gasket 120 which, when the seal ring is moved to its uppermost position as shown, engages with the undersurface of the load lock housing defining the opening 62 in the top of the load lock 32. Likewise, at the lower end of the seal ring 106 is disposed another ring 106 or seal gasket 122 which is engaged against the corresponding opposed surface of the inwardly directed shoulder 102 to effect sealing at the lower end of the ring seal. In this way, the seal ring 106 serves as a vacuum type barrier between the internal confines 31 of the load lock chamber 32 and that of the transport chamber 30.

Referring now to FIG. 4, and to a second embodiment of the invention, it should be seen that in the embodiment shown therein, the first vertical actuator means 88' is mounted to the shroud 52 and is drivingly movably connected to the top cover plate 60 rather than to the base plate 70 as is the case in the example of FIG. 3A. In the embodiment of FIG. 4, the seal ring 106' differs from that shown in FIG. 3A by including an integrally formed floor portion 130 extending horizontally across the base thereof. The floor portion includes an opening 132 which permits air to pass between the separated chambers during vertical movement.

In addition, the lower portion of the seal ring 106' includes a ring or seal gasket 134 which is engaged against the corresponding opposed surface of the inwardly directed shoulder 102' to effect sealing at the lower end of the seal ring when the seal ring 106' is moved to its uppermost position and has another ring or seal gasket 134' at its top end which engages the undersurface of the load lock housing defining the opening 62 in the top of the load lock 32 when the ring is moved to its uppermost position.

Also, the well 100' as shown in the embodiment of FIG. 4 is defined simply by an open space with the base plate member 84' of the load lock 32 being defined simply by horizontally extending plate. Since the first vertical actuator means 88' is disposed on the shroud 52, it is possible to locate the second vertical actuator means 110' coincidentally with the central axis CA thereby eliminating the need for additional actuators to work symmetrically with the one.

Figure 6:
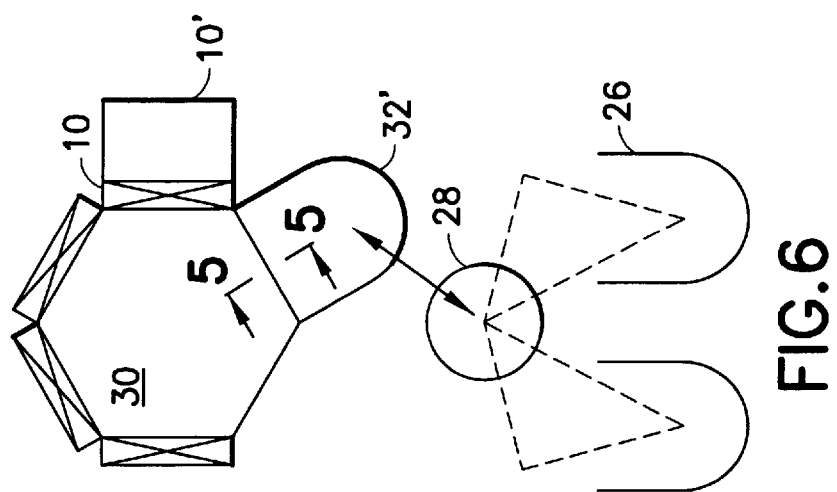
FIG. 6 is a schematic plan view of how the load lock of FIG. 5 would be incorporated into the system of the present invention.

Referring now to FIGS. 5 and 6, it should be seen that a third embodiment of the invention is shown. Here an over under structure is shown which allows a single load lock to function as seen in FIG. 6 as would the two load lock system of FIG. 1. The load lock 32' shown therein includes two shrouds 52 and 52' each opening outwardly in vertical alignment with one another toward the transport robot 28. The load lock 32' contains two internal chambers, namely, internal chamber 31 and 31' separated, respectively by a fixed base member 150 in the form of a horizontally extending base plate 150. The lower internal chamber 31 includes a seal ring which is of the type discussed above with reference to FIG. 3A. That is, the seal ring 106 is a gasket structure with a flange disposed along its base and operates against an abutment shoulder 102 and fixed base member 150 on the load lock 32'. In the upper internal chamber 31' a similar seal ring 106' is provided, but this seal ring is disposed in an upside down manner such that its annularly horizontally extending shoulder is disposed at its top end and the otherwise disposed top vertically disposed end is located at the bottom of the seal ring 106'.

Thus, for the lower chamber 31, movement of associated vertical actuators upwardly will cause the seal ring 106 to be closed while downward movement thereof will cause it to become open. Conversely, for the upper chamber 31', movement of the vertical actuator(s) associated with the seal ring 106' in an upward manner will cause the seal ring 106' to become open while movement of the vertical actuator downwardly will cause the seal ring 106' to be closed. Also, in the embodiment of FIG. 5, both the first and second actuators means would be disposed laterally offset of the central axis.

By the foregoing, a new and improved load lock has been disclosed by way of the preferred embodiments. However numerous modifications, substitutions may be had without departing from the spirit of the invention. For example while the seal rings and associated structure, such as the wells 100, 100' are shown in what can be described as an annular shape, it is within the purview of the invention to use a seal ring and associated structure which has any closed form shape, such as a rectangular or square shape.

What is claimed is:

1. A load lock comprising:
   a housing defining an internal chamber having a first opening and a second opening communicating therewith;
   a substrate carrier located within said internal chamber and movable therein through said second opening;
   said substrate carrier being aligned with each of said first and second openings and adapted to allow substrates to be moved through said first opening onto said substrate carrier;
   said housing supporting said movable substrate carrier; and
   a seal ring having a first seal and a second seal, said seal ring having a seal ring opening adapted to allow gas to pass through said seal ring, said seal ring disposed within said internal chamber and movable, independent of said substrate carrier, between an upper closed position at which the first opening is blocked by said seal ring and a lower open position at which the first opening is open to said internal chamber allowing substrates to be moved through said first opening onto said substrate carrier.

2. A load lock as defined in claim 1 further characterized by said internal chamber having a perimeter shoulder and said seal ring having a horizontally extending portion on which is formed a coacting shoulder.

3. A load lock as defined in claim 2 further characterized in that said seal ring has a flat top surface and said top surface includes said first seal, said shoulder on said seal ring further including said second seal whereby said first seal engages an undersurface of the load lock chamber and said second seal engages said shoulder formed on said internal chamber.

4. A load lock as defined in claim 3 further characterized in that said substrate carrier includes a cover plate having a diameter greater than that of said second opening so as to seal said second opening when said plate is drawn against said load lock.

5. A load lock as defined in claim 4 further characterized by the substrate carrier having a plurality of supporting arms depending from said cover plate on which shelves for supporting substrates are fixed.

6. A load lock as defined in claim 5 further characterized by said seal ring having an open base and a vertical actuator associated with said substrate carrier being located on said housing below said seal ring.

7. A load lock as defined in claim 2 further characterized by said seal ring having a base and a first vertical actuator associated with said seal ring being connected to said seal ring at the base thereof.

8. A load lock as defined in claim 7 further characterized by said load lock having a shroud communicating with said second opening and having a shroud opening facing outwardly thereof.

9. A load lock as defined in claim 8 further characterized by said load lock being a tandem load lock with two vertically stacked internal chambers separated by a base plate with each of said chambers communicating with individual first openings in said load lock.

10. A load lock as defined in claim 9 further characterized in that said lower of said two load lock internal chambers having a shroud disposed below it and said upper of said two load lock chambers having a shroud disposed above it and wherein each of said shrouds has an opening which faces in the same direction as the other.

11. A load lock as defined in claim 10 further characterized by said lower load lock chamber includes a rigid seal ring having a perimeter base shoulder disposed at its bottom and said top load lock chamber includes a rigid seal ring with a perimeter base shoulder disposed at its top end thereon.

12. A load lock as defined in claim 11 further characterized as including a robot exteriorly of said load lock for providing a supply of substrates and for moving said substrates between each of said shrouds.

13. A load lock as defined in claim 8 further characterized as including a robot exteriorly of said load lock for providing supply of substrates and for moving said substrates through said shroud and into said load lock.

14. A load lock as defined in claim 8 further characterized by a second vertical actuator operatively connected with said substrate carrier and mounted to said shroud for moving said substrate carrier between vertically distinct positions and;

said first vertical actuator being located on said housing below said seal ring.

15. A load lock as defined in claim 2 further characterized by said shoulders on said internal chamber and on said seal ring being engaged when said seal ring is in its closed position.

16. A load lock comprising:

a housing defining an internal chamber having a first opening and a second opening communicating therewith;

a substrate carrier located within the internal chamber and movable through the second opening; and a seal ring having a first seal and a second seal, the seal ring having an opening adapted to allow gas to pass through the seal ring, the seal ring disposed within the internal chamber and movable, independent of said substrate carrier, between a closed position at which the first opening is blocked and a open position at which the first opening is open to the internal chamber allowing substrates to be moved along a substrate path through said first opening onto said substrate carrier.

17. The load lock of claim 16 wherein the first seal and the second seal are located on opposing sides of the substrate path when the seal ring is in the closed position.

18. The load lock of claim 16 further comprising a first actuator connected to the seal ring, and a second actuator connected to the substrate carrier.

19. The load lock of claim 16 wherein the substrate carrier includes a cover plate that seals the second opening.

20. The load lock of claim 16 wherein the second seal has a larger sealing diameter than the first seal.

* * * * *